(12) United States Patent
Leussler

(10) Patent No.: US 6,906,518 B2
(45) Date of Patent: Jun. 14, 2005

(54) RF COIL SYSTEM FOR MAGNETIC RESONANCE IMAGING APPARATUS

(75) Inventor: Christoph Guenther Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/301,259

(22) Filed: Nov. 21, 2002

(65) Prior Publication Data

US 2003/0122546 A1 Jul. 3, 2003

(30) Foreign Application Priority Data

Nov. 21, 2001 (DE) .......................................... 101 57 039

(51) Int. Cl.$^7$ ................................................ G01V 3/00
(52) U.S. Cl. ..................................... 324/318; 600/422
(58) Field of Search ................................ 324/318, 322, 324/306, 307, 309, 314; 600/422

(56) References Cited

U.S. PATENT DOCUMENTS

| | | | | |
|---|---|---|---|---|
| 5,374,890 A | * | 12/1994 | Zou et al. | 324/318 |
| 5,445,153 A | * | 8/1995 | Sugie et al. | 600/422 |
| 6,590,392 B2 | * | 7/2003 | Boskamp et al. | 324/318 |

FOREIGN PATENT DOCUMENTS

DE          40 30 878 A1     4/1992

OTHER PUBLICATIONS

Markus Weiger, Klaas P. Pruessmann, Peter Boesiger; "2D SENSE for Faster 3D Imaging"; Proc. Int'l. Society Mag. Reson. Med. 8 (2000), p. 152.

Klass P. Pruessmann, Markus Weiger, Markus B. Scheidegger, Peter Boesiger, "SENSE: Sensitivity Encoding for Fast MRI"; Magnetic Resonance in Medicine 42:952–962(1999).

* cited by examiner

Primary Examiner—Louis Arana
(74) Attorney, Agent, or Firm—Thomas M. Lundin

(57) ABSTRACT

An RF coil system for a magnetic resonance imaging apparatus whereby a substantially computer-aided and hence automatically optimized image quality in respect of signal-to-noise ratio and resolution can be achieved in dependence on the type and size of the object to be imaged, without time-consuming replacement or manual positioning of the RF coil system being necessary. To this end, the coil system (A) includes a plurality of single RF coils (Sx) which are essentially decoupled from one another and have a different size and/or different position, as well as a control device with a plurality of transmission units which are associated with a respective RF coil and whereby one or more RF coils can be selected and supplied with an RF pulse having an independently adjustable amplitude and/or phase and/or pulse shape. The invention also relates to a magnetic resonance imaging apparatus provided with such an RF coil system.

14 Claims, 9 Drawing Sheets

Figure 1:
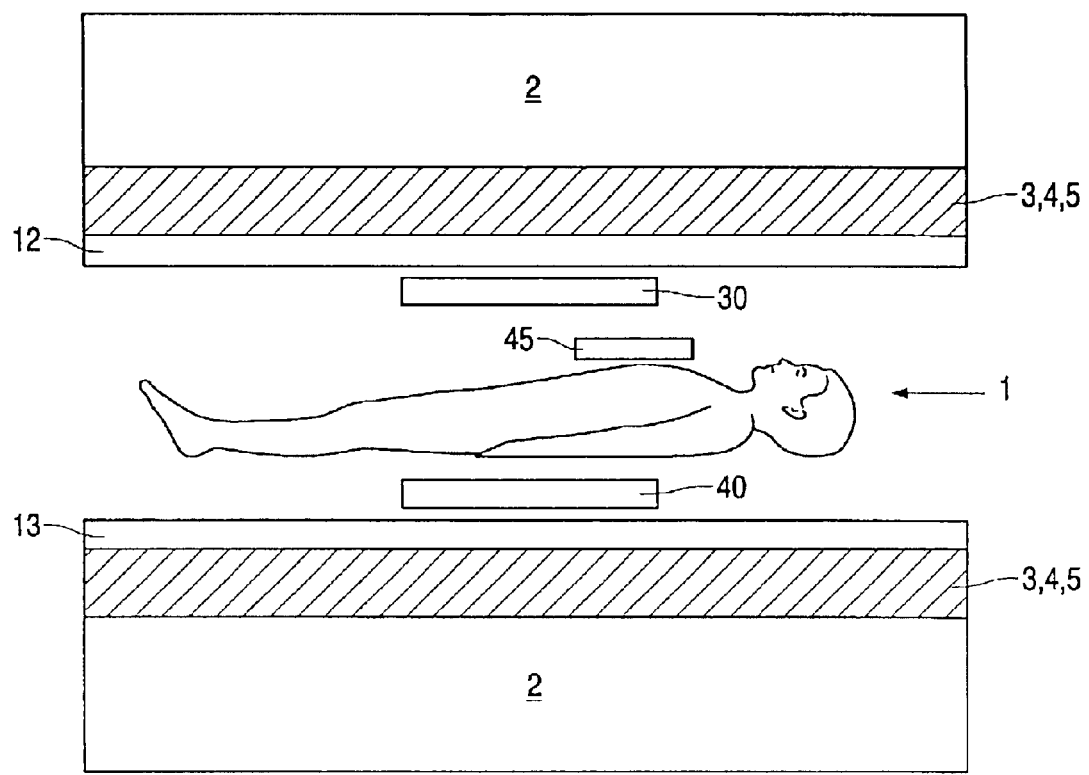

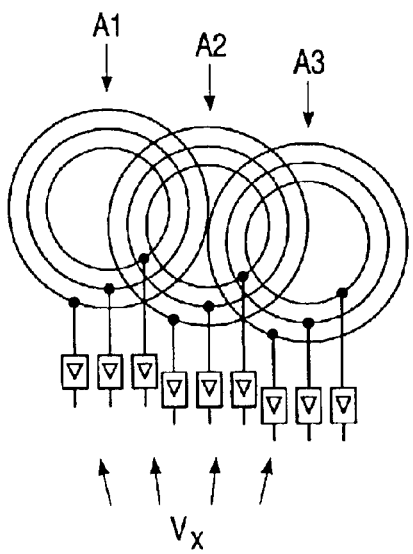 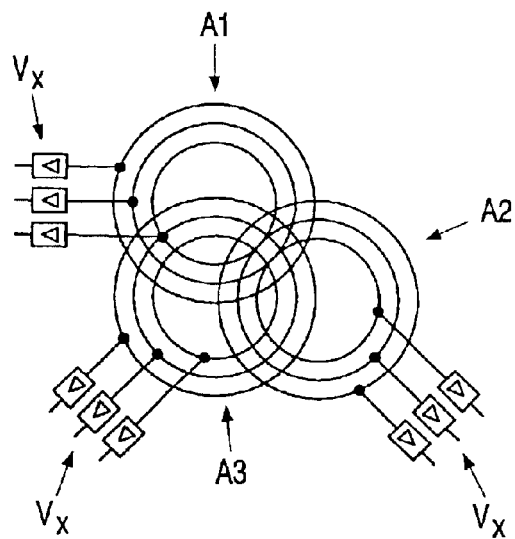
FIG. 6A  FIG. 6B
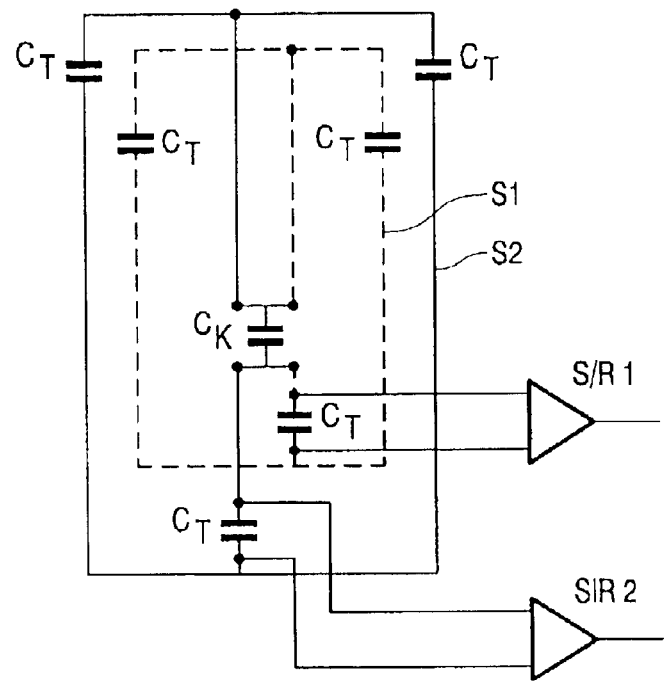
FIG. 7

☐ S1(S1')
○ S2(S2')

RF COIL SYSTEM FOR MAGNETIC RESONANCE IMAGING APPARATUS

BACKGROUND

The invention relates to an RF coil system for a magnetic resonance imaging apparatus and to a magnetic resonance imaging apparatus of this kind.

Magnetic resonance imaging (MRI) apparatus is used notably for the examination and treatment of patients. The nuclear spins of the tissue to be examined are then aligned by means of a basic magnetic field and excited by RF pulses. The RF relaxation processes thus induced are subjected to gradient magnetic fields and are received and processed so as to form an image of the examination zone.

A distinction can be made between the so-called open MR systems (vertical systems) in which a patient is introduced into an examination zone which is situated between the ends of a C-arm so that the patient is accessible from practically all sides during the examination or treatment, and MR systems which comprise a tubular examination zone (axial systems) in which the patient is introduced. These differences also necessitate completely different arrangements and configurations of the devices whereby the basic magnetic field, the gradient magnetic fields and the RF signals are generated and received.

The transmission and reception of the RF signals necessitates the use of RF coil systems whose configuration and position have a decisive effect on the image quality, that is, on the signal-to-noise ratio and the resolution in particular. In addition to the RF coil systems which are permanently mounted in the system, use is made of so-called RF body coils which can be flexibly arranged, for example, as sleeves or pads, around or on the zone to be examined.

Not only the type of MR apparatus but notably also various patient data such as the size of the patient as well as the type, position, depth and dimensions of the zone (organ) to be examined and any motions in this zone etc. are of decisive importance for the optimization or selection of the RF coil systems. Therefore, at the beginning of an examination the user generally has to carry out test exposures by means of RF coils of different size and in different position so as to achieve an optimum image of the zone to be examined. This procedure may be very time-consuming, the more so when the patient must be moved out of the MR apparatus a number of times. This is the case notably when an axial system is concerned.

In order to avoid this problem, for example, from DE 40 30 878 it is known to utilize a double surface coil with two single coils which can be activated, via switches, either individually or in combination so as to achieve an optimum image quality.

SUMMARY

It is an object of the present invention to provide an RF coil system of the kind set forth which can be comparatively simply adapted even better to a given exposure situation so as to enhance the image quality.

It is also an object of the invention to provide an RF coil system of the kind set forth which enables controlled optimization of the image quality in respect of given parameters such as, for example, the signal-to-noise ratio or the temporal or spatial resolution.

It is a further object of the invention to provide an RF coil system whose effective size and position can be changed without necessitating replacement of the coil system and removal of a patient from the MR apparatus.

Finally, it is an object of the invention to provide an MR imaging apparatus which enables comparatively fast imaging while utilizing the RF coil system in accordance with the invention, that is, without having to accept a degrading of the image quality.

In conformity with one aspect of the invention, the object is achieved by means of an RF coil system which includes a plurality of single RF coils which are essentially decoupled from one another and have a different size and/or different position, as well as a plurality of transmission units which are associated with a respective RF coil in order to select one or more RF coils and to supply the selected RF coils with an RF transmission pulse whose amplitude and/or phase and/or pulse shape can be independently adjusted.

This solution combines a number of advantages and enables a highly computer-aided and hence automatically optimized image quality to be achieved without time-consuming replacement or manual positioning of the RF coil system. This implies a significant saving of time, in particular in the case of an axial system, since the patient need no longer be removed from such an MR imaging apparatus.

A change of the effective position of the coil system as well as of the size thereof, determining the penetration depth of the field in the tissue, is enabled by an appropriate selection of the RF coil (coils). The configuration of the field of the coil system, that is, notably the homogeneity and symmetry thereof, can be optimized by changing the amplitude, the phase and/or the shape of the RF transmission pulse.

An embodiment in conformity with a more limited aspect of the invention achieves the above advantages also when the RF coil system is operative to receive RF signals.

The configuration of the transmission or receiving field can be optimized by means of the embodiment disclosed in another more limited aspect of the invention.

The embodiments disclosed in other more limited aspect of the invention are particularly flexibly adjustable in respect of the above parameters.

The embodiment disclosed in another more limited aspect of the invention notably relates to MR imaging apparatus comprising a tubular examination space (axial systems), whereas the embodiment in conformity with yet another more limited aspect of the present invention can be used as a body coil, that is, independently of the type of MR imaging apparatus.

In accordance with one aspect of the invention an RF coil system which is intended notably for use in a magnetic resonance imaging apparatus is provided. The RF coil system includes a plurality of single RF coils which are essentially decoupled from one another and have a different size and/or different position, as well as a plurality of transmission units which are associated with a respective RF coil in order to select one or more RF coils and to supply the selected RF coils with an RF transmission pulse whose amplitude and/or phase and/or pulse shape can be independently adjusted.

In accordance with a more limited aspect of the invention, the RF coil system includes a plurality of receiving units which are associated with a respective RF coil and can be individually activated or deactivated.

In accordance with a more limited aspect of the invention, coupling between the RF coils can be adjusted by means of capacitances and/or inductances and/or transformers in order to achieve a desirable, notably homogeneous and symmetrical field configuration of the RF coil system.

In accordance with a more limited aspect of the invention, the RF coil system includes a plurality of concentrically arranged RF coils.

In accordance with a more limited aspect of the invention the RF coil system includes a plurality of adjacently arranged RF coils.

In accordance with a more limited aspect of the invention, a plurality of first RF coils are arranged adjacent one another and are enclosed together by a second RF coil.

In accordance with a more limited aspect of the invention, the coil system is formed by at least one first RF coil which extends along the surface of the cylinder and by a second, shorter RF coil which is superimposed thereon.

In accordance with a more limited aspect of the invention, the coil system is provided on a flexible supporting material so that it can be used as a body coil.

In accordance with another aspect of the invention, a magnetic resonance imaging apparatus is provides which includes at least one RF coil system as described herein.

In accordance with a more limited aspect of the invention, the magnetic resonance apparatus includes an arithmetic unit for selecting the transmission units for the RF coils and for controlling the selected transmission units in order to supply the selected RF coils with an RF transmission pulse having an independently adjustable amplitude and/or phase and/or pulse shape.

DRAWINGS

Figure 2:
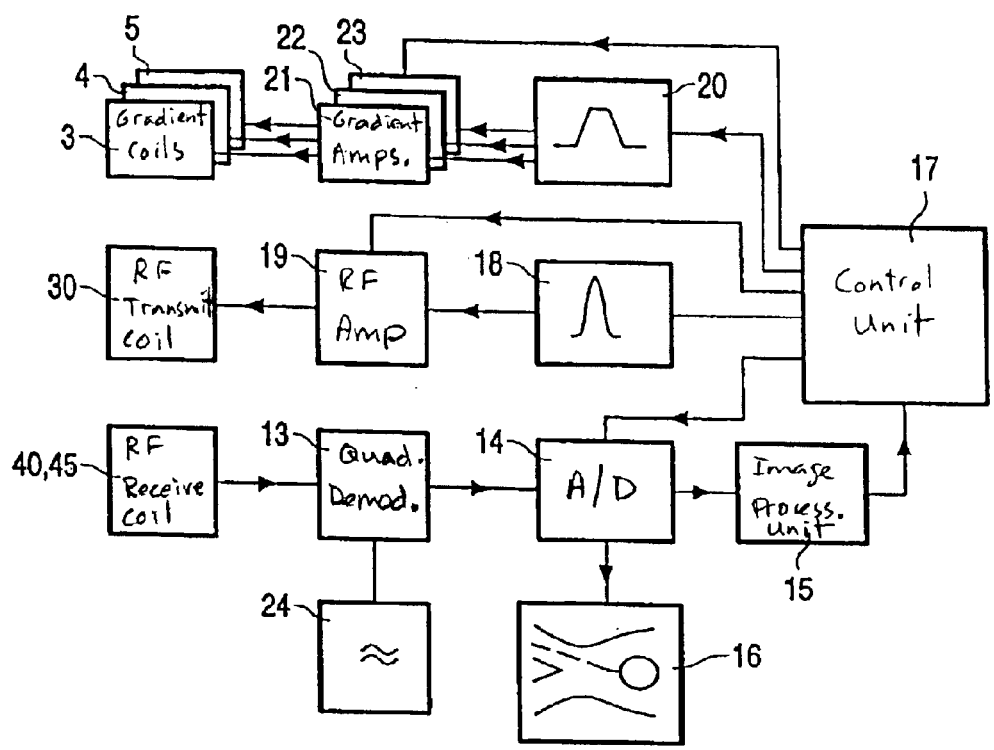
Figure 3:
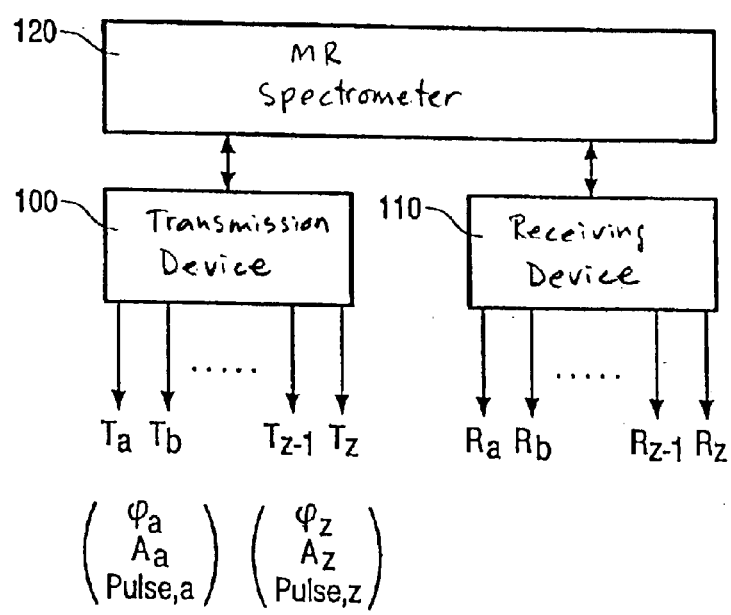
Figure 4:
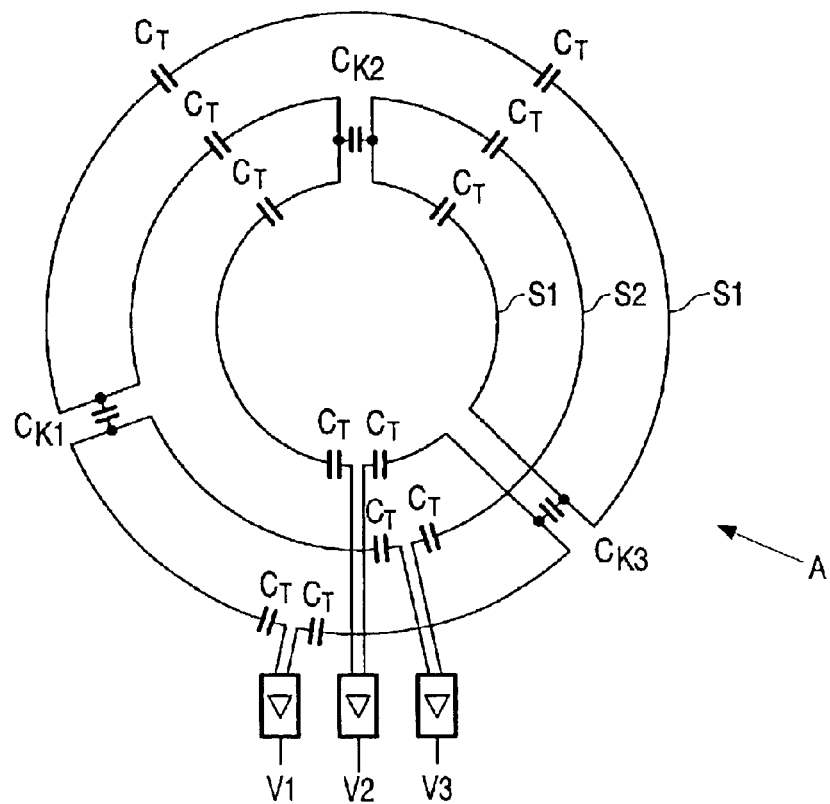
Figure 5:
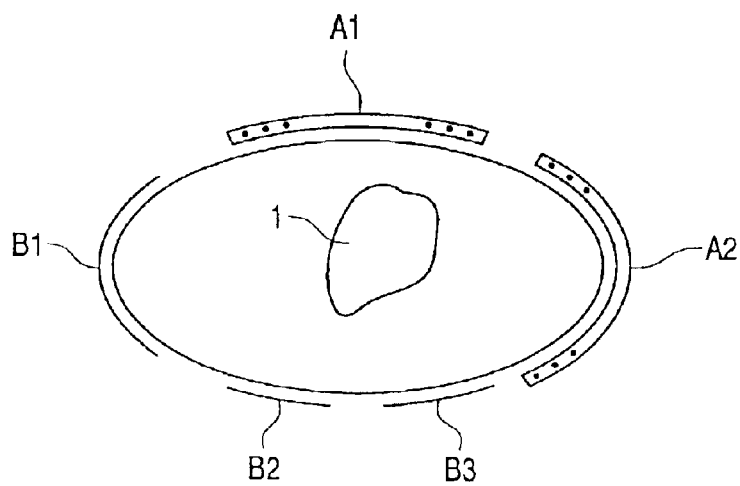
Figure 8:
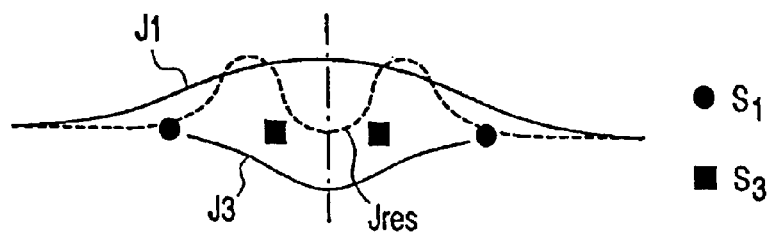
Figure 9:
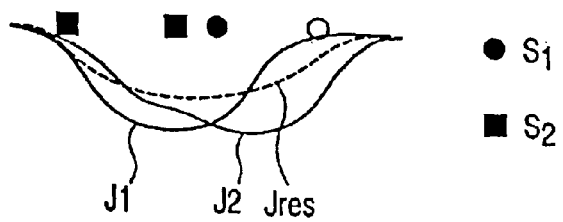
Figure 10:
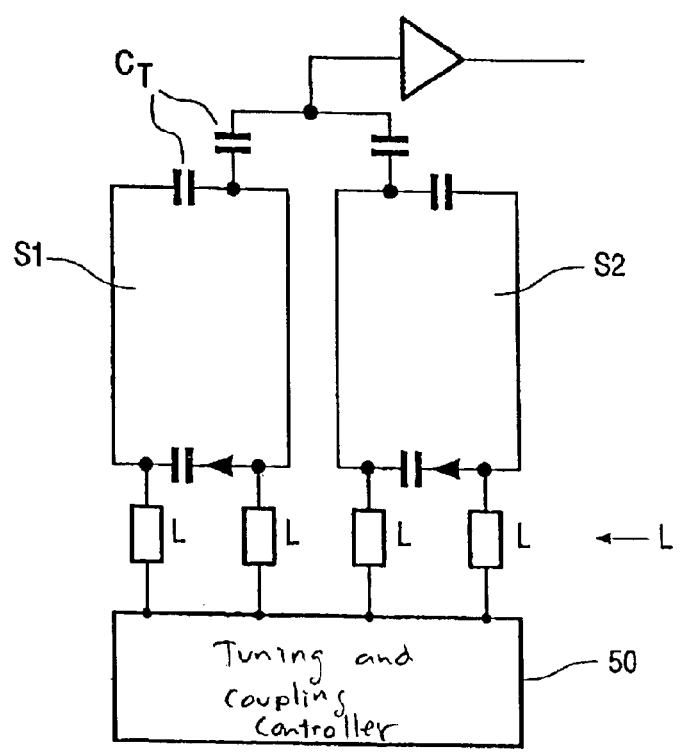
Figure 11:
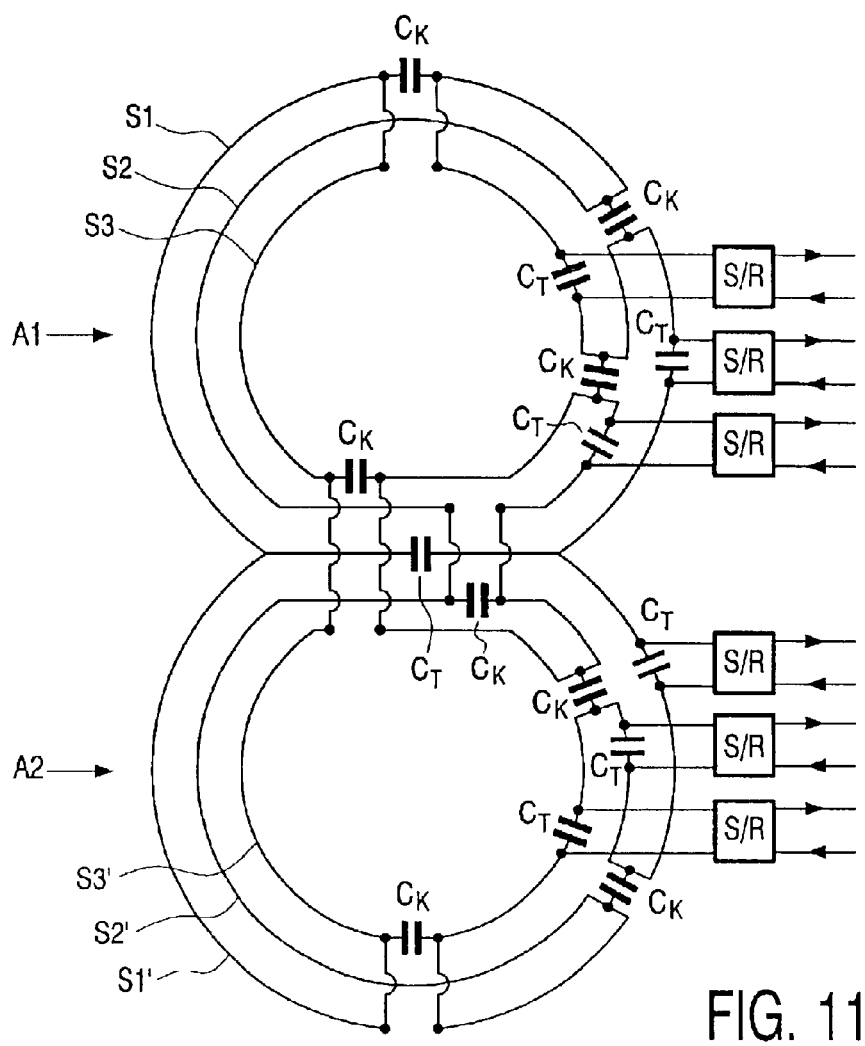
Figure 12:
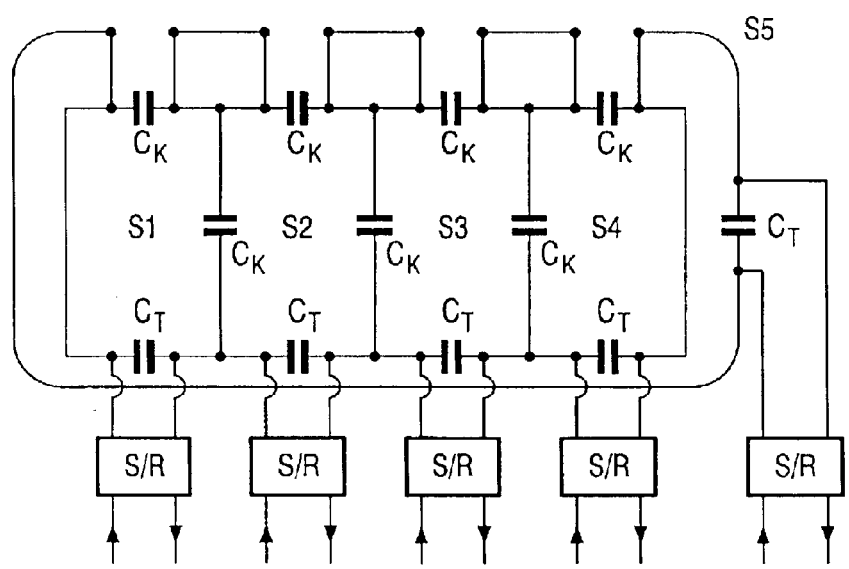
Figure 13:
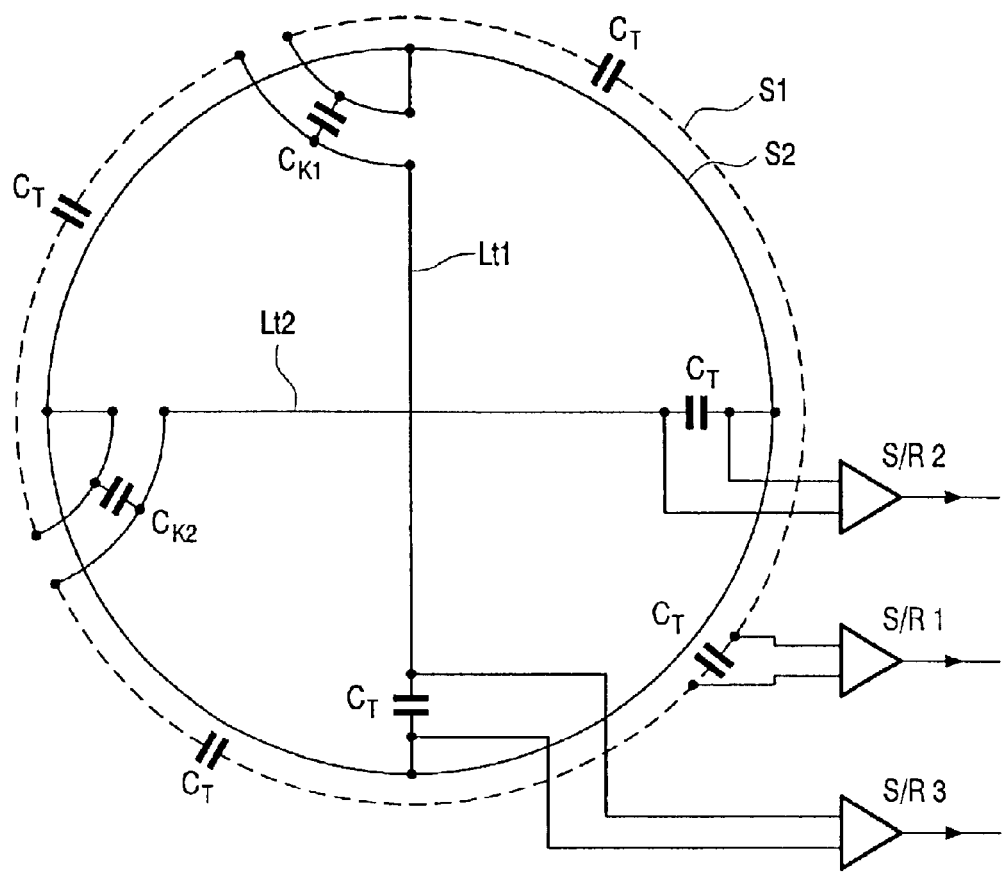
Figure 14:
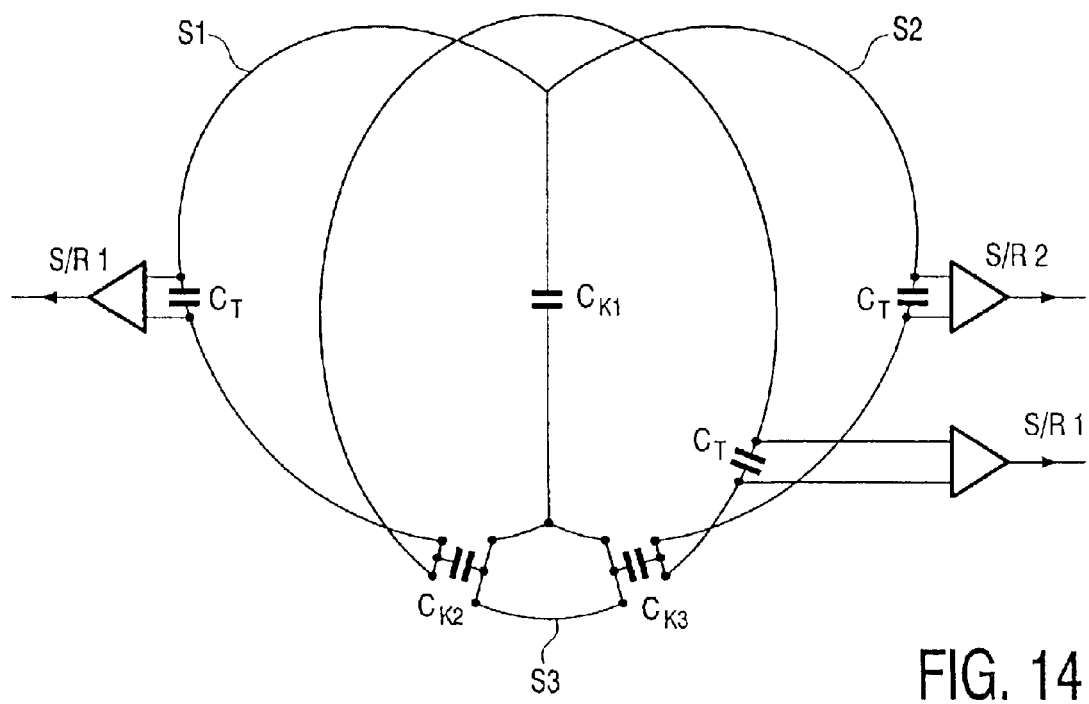
Figure 15A:
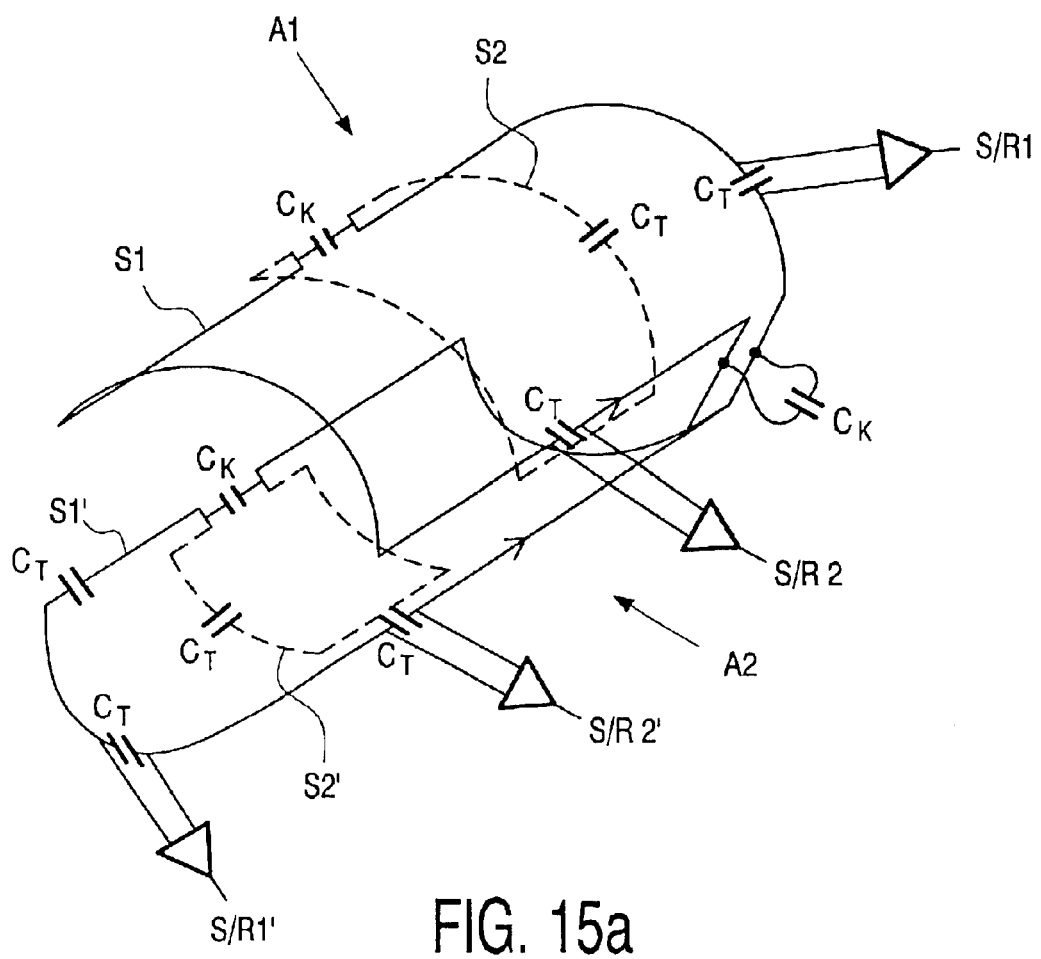
Figure 15B:
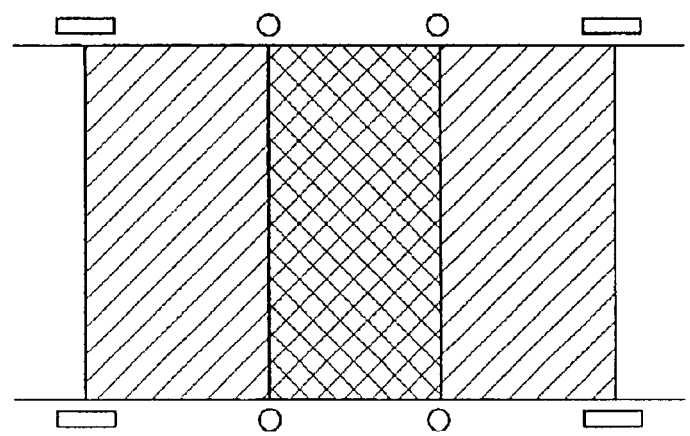
Figure 16:
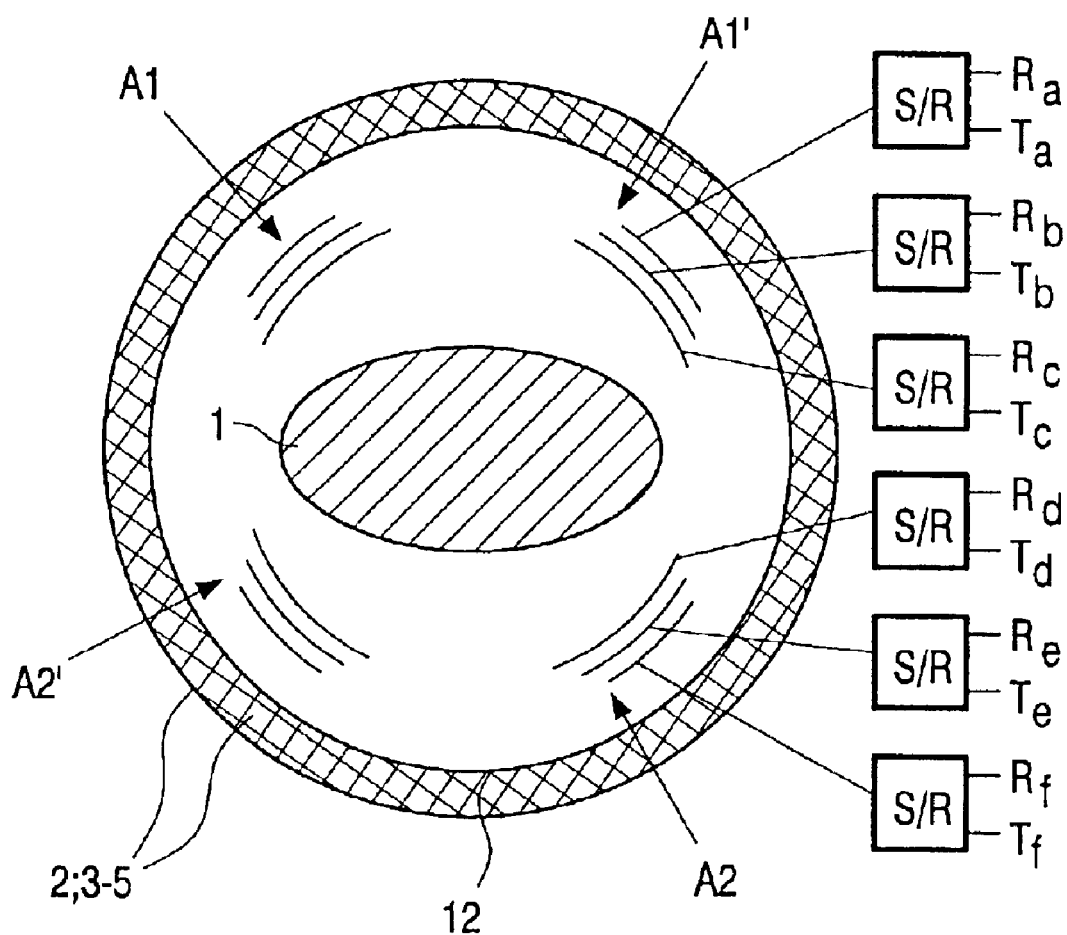

Further details, features and advantages of the invention will become apparent from the following description of preferred embodiments, given by way of example and with reference to the drawing. Therein:

FIG. 1 is a diagrammatic longitudinal sectional view of an MR imaging apparatus, FIG. 2 shows a circuit diagram with the essential components of an MR imaging apparatus, FIG. 3 shows a block diagram of a control circuit for the coils, FIG. 4 is a diagrammatic representation of a first coil system, FIG. 5 is a diagrammatic representation of a first combination of coil systems, FIGS. 6a, 6b are diagrammatic representations of a second and a third combination of coil systems, FIG. 7 is a diagrammatic representation of a second coil system, FIG. 8 is a first diagrammatic representation of the field configuration of individual coils, FIG. 9 is a second diagrammatic representation of the field configuration of individual coils, FIG. 10 shows a block diagram of a device for controlling the coil systems, FIG. 11 is a diagrammatic representation of a third coil system, FIG. 12 is a diagrammatic representation of a fourth coil system, FIG. 13 is a diagrammatic representation of a fifth coil system, FIG. 14 is a diagrammatic representation of a sixth coil system, FIG. 15 is a diagrammatic representation of a fourth combination of coil systems, and FIG. 16 is a cross-sectional view of the fourth combination of coil systems.

DESCRIPTION

FIG. 1 is a diagrammatic longitudinal sectional view of a magnetic resonance imaging apparatus (MR examination apparatus) which comprises a tubular examination space (axial system). An object 1 to be examined, for example, a patient is situated in the examination space. The examination space is enclosed by a magnet coil 2 for generating a uniform, steady basic magnetic field ($B_0$ field or main field for magnetizing the object to be examined, that is, for aligning the nuclear spins) which extends through the examination space in the axial direction (z direction), the magnetic flux density (magnetic induction) being of the order of magnitude of from some tenths of Tesla to some Tesla.

For spatial discrimination and resolution of the signals emanating from the object 1 to be examined, the examination space is enclosed by three gradient magnetic field coils 3, 4, 5 (not shown in detail) which generate three gradient magnetic fields which extend in the direction of the z axis. A first gradient magnetic field varies essentially linearly in the direction of the x axis, whereas a second gradient magnetic field varies essentially linearly in the direction of the y axis and a third gradient magnetic field varies essentially linearly in the direction of the z axis.

In order to excite nuclear magnetization (spin resonance) in the object to be examined, an RF transmission coil system 30 (RF surface resonator) which can be supplied with an RF pulse is arranged over the object so that the object can be traversed by an RF magnetic field ($B_1$ field). For the acquisition of the relaxation which succeeds the excitation and induces a further change of the magnetization states in the object there is provided an RF receiving coil system 40 (RF surface resonator) which is arranged underneath the object and in which a corresponding voltage is induced by this change. When appropriate switching over is applied, a common RF coil system can also be used for the transmission and reception or the two RF coil systems can alternately serve for common transmission and reception. Between the RF coil systems 30, 40 and the respective neighboring gradient magnetic field coils 3, 4, 5 there is provided a respective shield 12, 13 for shielding the RF coil systems from the gradient magnetic coils.

Furthermore, for given examinations RF body coil systems 45 can also be used as receiving coils which are applied directly to the patient 1 or to the zone to be examined. Generally speaking, such RF body coils are flexible and formed as pads or sleeves.

The signals received by the RF coil systems 40, 45 are evaluated for MR imaging, the gradient magnetic fields enabling localization of the excited states.

The components which are of essential importance for the operation of such an MR imaging apparatus are diagrammatically shown in FIG. 2 and include a control unit 17 which controls a gradient waveform generator 20; to the respective outputs of this generator there are connected a first, a second and a third gradient amplifier 21, 22, 23. These amplifiers generate the respective currents for the gradient coils 3, 4, 5. The gain factors of these amplifiers can be adjusted independently of one another, the coils then generating the gradient fields in the x direction, the y direction and the z direction and enabling slice selection in known manner in the corresponding three spatial directions in the zone examined.

Furthermore, for each transmission coil of an RF coil system there is provided a transmission channel which is controlled by the control unit 7 and comprises essentially a respective RF generator 18 whereby the frequency of the RF pulses is tuned to the Larmor frequencies which are dependent on the gradient fields. The RF pulses are applied to an amplifier 19 which is controlled by the control unit 17 and whereby their amplitude, phase and pulse shape thereof are adjusted; they ultimately reach the transmitting RF coil system 30.

The MR signals which are induced in the RF coil systems 40, 45 (intended for reception) by the relaxation of the excited magnetization states are demodulated in a receiving channel, associated with each coil, by means of a quadrature demodulator 13 by way of mixing with two 90° mutually offset carrier oscillations (having a Larmor or MR frequency determined by the local strength of the steady magnetic fields) of an oscillator 24, thus giving rise to two signals which may be considered as the real part and the imaginary part of a complex signal. These signals are applied to an analog-to-digital converter 14. Finally, the MR images are reconstructed in known manner by means of an image processing unit 15 and are displayed on a monitor 16.

The RF coil systems in accordance with the invention can be used in the described axial system as well as in a vertical system (open MR imaging apparatus) with a basic magnetic field which vertically extends through the examination space.

Furthermore, the RF coil systems in accordance with the invention can be used as transmission coils 30 as well as receiving coils 40, 45; for alternating operation each coil is then connected to a combined transmission/receiving channel S/R which can be switched over accordingly, for example, by means of diodes.

FIG. 3 shows a block diagram of a device for controlling the transmission/receiving channels S/R of each individual coil of an RF coil system. For each RF coil the device includes a transmission unit and a receiving unit which are combined in FIG. 3 so as to form a transmission device 100 with z channels and a receiving device 110 with z channels (z=number of RF coils), respectively. The outputs of the transmission device 100 carry RF voltages T with a separately adjustable phase, amplitude and pulse shape for the RF coils. The inputs of the receiving device 110 carry the RF receiving signals R of each RF coil. Finally, an MR spectrometer 120 is bidirectionally connected to the two devices 100, 110, said spectrometer enabling adjustment of the transmission device 100 and evaluation of the signals received.

When the RF coil systems described hereinafter are to be used as body coils, they are accommodated on a suitably flexible supporting material and connected, if necessary, to preamplifiers with suitable networks in order to correct changes of the electrical properties which may be caused by bending.

FIG. 4 shows a first embodiment of an RF coil system in accordance with the invention which consists of three concentrically arranged individual surface coils S1, S2, S3 (denoted in general by the reference Sx). The coils are magnetically decoupled from one another. To this end, three decoupling capacitors $C_{k1}$, $C_{k2}$, $C_{k3}$ are provided between the individual coils in order to influence the current phase distribution in the coil system, said capacitors being tuned in such a manner that the various modes are decoupled.

For the decoupling use can also be made (additionally or alternatively) of small transformers, for example, types which comprise a ring core (small stray field) and in which two inductances are wound on a common core. This is applicable to all embodiments to be described hereinafter.

Each coil is connected to a respective preamplifier V1, V2, V3 (denoted in general by the reference Vx) as well as to an associated receiving channel and/or transmission channel, so that three different images can be generated or acquired at the same time. Furthermore, a number of tuning capacitors $C_T$ is switched on in various conductor segments of the individual RF coils. Consequently, in the relevant RF coils resonances and hence current variations can be initiated in conductor loops (meshes) formed by such conductor segments.

An RF coil system of this kind can be electrically adapted to the zone to be examined by selection of one or more of the individual coils S1, S2, S3, so that, in dependence on the type, dimensions, depth, motion etc. thereof, an optimum signal can be produced in respect of the signal-to-noise ratio, the resolution and/or in respect of a minimum motional unsharpness.

For example, the penetration depth of the transmission field or receiving field of an RF coil is essentially proportional to the magnitude thereof. In the case of circular coils as shown in FIG. 4, the effective penetration depth is essentially equal to their radius. Therefore, when the tissue to be imaged is situated at the surface of the body, the coil S2 or S3 should be selected for transmission and reception.

The signal-to-noise ratio can be locally enhanced by combining the images of two coils. Therefore, when in the case of FIG. 4, for example, the first and the third coil S1, S3 are simultaneously used, the total integral noise voltage in the combined image will be composed of the contributions from two different volumes. The correlation of the noise is dependent on the overall size, the shape, the conductivity and the position of the imaged zone relative to the coils. Therefore, the noise components produced by the two coils cannot be fully correlated to one another. It is to be noted that in the case shown a correlation of less than 30% is obtained. Consequently, in the zone covered by the two coils S1, S3, that is, the zone which is situated directly below the surface of the body, a signal-to-noise ratio is obtained which is higher than that obtained in the zone which is situated deeper into the body and is covered only by the larger first coil S1.

Finally, the RF coil system can also be used in combination with other single body coils which are suitably arranged together on oppositely situated sides of a zone to be examined (or the body of the patient 1) in order to enable an optimum image to be formed also of moving zones (for example, the heart). The aim is to realize as short as possible acquisition times in order to achieve a suitable temporal resolution. Notably in the case of the known SENSE (sensitivity encoding) imaging it is possible to choose short acquisition times for an adequate field of view, so that a correspondingly larger number of images can be formed. A slightly less favorable signal-to-noise ratio can then be avoided by way of a volume coil composed of a plurality of single coils or coil systems.

FIG. 5 shows an example of such a first combination of coil systems for a coronary examination during which two adaptable RF coils systems A1, A2 and three single surface coils B1, B2, B3 are arranged around the torso of a patient 1. An optimally adapted volume coil system is thus realized. The various coils A1, A2, B1, B2, B3 can be decoupled from one another by way of partial overlapping or an adequate distance between these coils and/or adaptation via L/C circuits.

In addition to the described adjustability of the effective size of the RF coil system, for given examinations it is important that its effective position relative to a patient can also be changed as simply as possible. To this end, a plurality of the described RF coil systems A1, A2, A3 can be arranged so as to overlap one another differently and adjoin the zone to be examined. FIG. 6a shows such a second combination whereas FIG. 6b shows a third combination of RF coil systems.

The magnetic decoupling from one another is then achieved either by the overlapping or by maintaining an adequate distance between the RF coil systems. The operator of the system can select the RF coil system A1, A2, A3 with the optimum position via suitable switches. The single coils S1, S2, S3 of each coil system again operate via respective transmission/receiving channels V1, V2, V3 (denoted in general by the reference Vx).

Additionally or alternatively one or more butterfly coil systems can be used in these and other combinations; an exemplary embodiment of such a butterfly coil is shown in FIG. 7. This coil system is composed of two interleaved single butterfly coils S1, S2 which are decoupled from one another via a capacitance $C_K$. A number of tuning capacitors $C_T$ is again provided in various conductor segments of the individual RF coils for the purpose of tuning. Each coil is again connected to a combined transmission/receiving channel S/R1 or S/R2.

Finally, a further problem may arise in that the field strength variation of a single RF coil is distorted or inhomogeneous due to dielectric resonance effects. The approximation of Biot-Savart's law for low frequencies then gives rise to excessive deviations in comparison with the actually measured values. The described RF system enables correction and tuning of these dielectric resonance effects in that in conformity with FIG. 8 the phase variations or amplitude variations of the currents I1, I3 on two single, interleaved coils S1, S3 are suitably changed and combined so that a more uniform, that is more homogeneous, variation Ires is obtained. To this end, for example, the decoupling capacitors $C_K$ can be conceived so as to be switchable by utilizing capacitance diodes or switched capacitors, so that the operator of the system can actively change the field strength variation. Such active control of the homogeneity of the field strength variation enables further enhancement of the image quality notably in the case of high field strengths.

The left-right symmetry of the field homogeneity of an RF coil is disturbed by the known LISA (local intensity shift artefacts) and dielectric resonance effects, that is, notably in the case of comparatively high RF frequencies and high field strengths (for example, 128 MHz, 3 Tesla). These effects and their causes are explained in "Magnetic Resonance in Medicine", 1989, p. 1175. In order to eliminate these disturbances, in conformity with FIG. 9 a configuration is chosen in which a coil is subdivided into two single, mutually decoupled coils or use is made of two single coils S1, S2 which form an RF coil system consisting of two adjacently situated single coils. For active control of the left-right symmetry of the homogeneity of the field and for achieving a desired field variation in general there is provided a device 50 as shown in FIG. 10 which serves for tuning control and is capable of changing the coupling between the single coils S1, S2. The coils in particular can be inductively coupled to one another to a given extent by means of inductances L and the RF current through the coils can be controlled by means of tuning capacitors $C_T$ in such a manner that at least a high degree of left-right symmetry is achieved.

The described homogenization control of the field of RF coils can be advantageously applied notably in the case of the so-called SENSE (sensitivity encoding) imaging. This method is described in detail in "Proceedings of the International Society of Magnetic Resonance in Medicine" 2000, p. 152 and in "Magnetic Resonance in Medicine" 1999, p. 952 and further. The geometry factor g described therein can be optimized by adjustment of the homogeneity of the field of the RF coil system by appropriate control of the coils; in the case of a plurality of coil systems (for example, in conformity with FIG. 5), one of the adaptable RF coil systems A1, A2 is then adjusted accordingly.

A further application is found when the described RF coil systems are used for transmission. In the RF coil system shown in FIG. 4 it is desirable to realize a mutual magnetic decoupling of approximately −20 dB for the three nested single RF surface coils S1, S2, S3. The local overall transmission field of this arrangement can be either actively homogenized or formed for the described SENSE imaging by appropriate adjustment of the phases or amplitudes of the currents through the single coils. In this case it makes sense to utilize a spatial encoding or recoding functionality, at the same time allowing pulses to be transmitted also with different shapes, so as to achieve imaging with an enhanced temporal and spatial resolution. A plurality of adaptable RF coil systems A1, A2, . . . can again be combined in this case.

These methods are applied notably for cardiac and head imaging, the latter case utilizing a coil system which includes a coil having a comparatively large diameter as well as a plurality of coils which have a comparatively small diameter and are arranged along the circumference of the large coil.

FIG. 11 shows a third RF coil system. Two single RF coil systems A1, A2 of the type shown in FIG. 4 are now arranged adjacent one another and the outer coils S1 of the two coil systems have a common segment. The decoupling of the individual coils is again realized by means of the decoupling capacitors $C_K$. A number of tuning capacitors $C_T$ is inserted in various conductor segments of the single RF coils. A respective combined transmission/receiving channel S/R is connected to each of the total number of six single coils S1, S2, S3, S1', S2', S3'; via such a combined transmission/receiving channel each single coil can be supplied with RF currents of different amplitude and phase and possibly of different pulse shape in the transmission mode in order to achieve, in conformity with the above description, a desired symmetry, homogeneity or irradiation characteristic or an effective size and effective position of the overall arrangement.

The foregoing can also be achieved in conformity with the above description by way of a suitable choice and combination of the single coils or coil systems.

FIG. 12 shows a fourth RF coil system in which four adjacently arranged RF coils S1, S2, S3, S4 are enclosed by a fifth RF coil S5. The coils are again decoupled from one another by means of decoupling capacitors $C_K$ and a number of tuning capacitors $C_T$ is inserted in various conductor segments of the single RF coils. Each single coil is again connected to a separately controllable transmission/receiving channel S/R. Using this RF coil system, the first through fourth coil S1 to S4 can produce fields with a comparatively small penetration depth on which a field having a larger penetration depth, generated by the fifth coil S5, is superposed. Selectable combination of these coils in conformity with the above description thus enables an optimum signal-to-noise ratio to be achieved in a desired location of an examination zone.

The third and the fourth RF coil system are suitable notably for use in conjunction with a SENSE imaging method.

FIG. 13 shows a fifth RF coil system in which a first, outer coil S1 encloses a second, inner coil S2. The first coil S1 is operated via a first transmission/receiving channel S/R1. In the second coil S2 there are provided two conductors Lt1, Lt2 which extend perpendicularly to one another and are connected to the second coil S2 at an angular distance of 90 degrees. A respective transmission/receiving channel S/R2, S/R3 for operating the second coil S2 is connected to each of the conductors. The two coils S1, S2 are decoupled from one another by means of decoupling capacitors $C_{K1}$, $C_{K2}$ and tuning capacitors $C_T$ are active again in various conductor segments of the single RF coils.

This fifth RF coil system can be advantageously used in particular in an HFO (high field open) system (open MR system). The coil system can be used independently of the field orientation, because selection of one of the three transmission/receiving channels S/R1, S/R2, S/R3 always enables activation of the appropriate RF coil.

FIG. 14 shows a sixth RF coil system in which a third coil S3 is superposed on a first and a second coil S1, S2, which are adjacently situated and decoupled from one another via a common branch with a first capacitance $C_{K1}$. The third coil is decoupled from the first coil S1 by way of a second capacitance $C_{K2}$ and from the second coil S2 by means of a third capacitance $C_{K3}$. Each of the three coils is again provided with tuning capacitors $C_T$ and is operated each time via a respective transmission/receiving channel S/R1, S/R2, S/R3.

A special advantage of this sixth RF coil system resides in the fact that adaptation to patients of different size is possible simply by switching over or selecting the coils S1, S2 and/or S3.

For an MR imaging apparatus comprising a tubular examination space as shown in FIG. 1 it is advantageous to use a (fourth) combination of RF coil systems which consists of so-called saddle coils as shown in a three-dimensional representation in FIG. 15a and in a plan view in FIG. 15b.

The RF saddle coil systems A1, A2 extend along the examination space and face one another. Each of these systems is composed of a respective first, long coil S1, S1' as well as a second, shorter coil S2, S2' which is superposed thereon. The single coils S1, S2; S1', S2' are again provided with tuning capacitors $C_T$, are decoupled from one another by means of decoupling capacitors $C_K$ and are operated via a respective transmission/receiving channel S/R1, S/R2; S/R1', S/R2'. In FIG. 15b the fields of the individual coils are denoted by different shading. This Figure shows that the fields of both coils are summed at the area of the shorter coil S2 (S2'), so that in this zone an improved signal-to-noise ratio of the RF coil system can be achieved in conformity with the description given with reference to FIG. 4.

FIG. 16 is a diagrammatic cross-sectional view of a tubular examination space with the coils shown in FIG. 15a. The coils 2; 3–5 necessary for generating the main magnetic field and the gradient magnetic fields are arranged at the circumference of this space and are separated from the inner space by an RF shield 12. A patient 1 is diagrammatically represented in the inner space and is enclosed by two pairs of each time two oppositely situated RF coil systems A1, A2; A3, A4 with each time three single RF coils. The RF coil systems are offset approximately 90 degrees relative to one another in the circumferential direction. Each single RF coil is operated via a respective transmission/receiving channel S/R which carry the transmission signals T and the receiving signals R.

One or more of the RF coil systems in accordance with the invention are preferably used in a magnetic resonance imaging apparatus whereby the RF coils or the coil systems can be computer-controlled, for example, in dependence on the type, size, position etc. of the object to be examined, so that they can be selected and controlled automatically to a high degree.

What is claimed is:

1. An RF coil system which is intended notably for use in a magnetic resonance imaging apparatus and includes a plurality of single concentrically arranged planar RF coils which are essentially decoupled from one another and have at least one of: 1) a different size; and 2) a different position with respect to one another; as well as a plurality of transmission units which are associated with a respective RF coil in order to select one or more RF coils and to supply the selected RF coils with an RF transmission pulse of which at least one the: 1) amplitude; 2) phase; and 3) shape can be independently adjusted.

2. An RF coil system as claimed in claim 1, which coil system includes a plurality of receiving units which are associated with a respective RF coil and can be individually activated or deactivated.

3. An RF coil system as claimed in claim 1, in which the coupling between the RF coils can be adjusted by means of at least one of 1) capacitances; 2) inductances; and 3) transformers in order to achieve a desirable, notably homogeneous and symmetrical field configuration of the RF coil system.

4. An RF coil system as claimed in claim 1, comprising a plurality of concentrically arranged RF coils.

5. An RF coil system as claimed in claim 1, comprising a plurality of adjacently arranged RF coils.

6. An RF coil system as claimed in claim 1, in which a plurality of first RF coils are arranged adjacent one another and are enclosed together by a second RF coil.

7. An RF coil system as claimed in claim 1, which coil system is formed by at least one first RF coil which extends along the surface of the cylinder and by a second, shorter RF coil which is superposed thereon.

8. An RF coil system as claimed in claim 1, which coil system is provided on a flexible supporting material so that it can be used as a body coil.

9. An RF coil system as claimed in claim 1, which coil system includes a plurality of receiving units which are associated with a respective RF coil and can be individually activated or deactivated.

10. An RF coil system which is intended notably for use in a magnetic resonance imaging apparatus and includes a plurality of adjacently arranged planar RF coils which are essentially decoupled from one another and have at least one of: 1) a different size; and 2) a different position with respect to one another; as well as a plurality of transmission units which are associated with a respective RF coil in order to select one or more RF coils and to supply the selected RF coils with an RF transmission pulse of which at least one the: 1) amplitude; 2) phase; and 3) shape can be independently adjusted.

11. An RF coil system as claimed in claim 10, in which the coupling between the RF coils can be adjusted by means of capacitances and inductances and/or transformers in order to achieve a desirable, notably homogeneous and symmetrical field configuration of the RF coil system.

12. An RF coil system as claimed in claim 10, in which the adjacently arranged RF coils are enclosed together by an additional RF coil.

13. An RF coil system as claimed in claim 10, which coil system is formed by at least one first RF coil which extends alone the surface of the cylinder and by a second, shorter RF coil which is superposed thereon.

14. An RF coil system as claimed in claim 10, which coil system is provided on a flexible supporting material so that it can be used as a body coil.

* * * * *